United States Patent [19]

Woo

[11] Patent Number: 5,266,901
[45] Date of Patent: Nov. 30, 1993

[54] APPARATUS AND METHOD FOR RESISTIVE DETECTION AND WAVEFORM ANALYSIS OF INTERCONENCTION NETWORKS

[75] Inventor: Ka-Chiu Woo, Hopewell Junction, N.Y.

[73] Assignee: International Business Machines Corp., Armonk, N.Y.

[21] Appl. No.: 890,910

[22] Filed: May 29, 1992

[51] Int. Cl.$^5$ .................. G01R 31/08; G01R 27/02
[52] U.S. Cl. .................... 324/537; 324/519; 324/677; 324/711; 324/718
[58] Field of Search ............... 324/519, 525, 537, 548, 324/549, 676, 677, 710, 711, 718

[56] References Cited
U.S. PATENT DOCUMENTS

| | | | |
|---|---|---|---|
| 4,019,129 | 4/1977 | Grau | 324/537 X |
| 4,565,966 | 1/1986 | Burr et al. | 324/519 |
| 5,006,808 | 4/1991 | Watts | 324/537 |
| 5,122,754 | 6/1992 | Gotaas | 324/676 |
| 5,138,266 | 8/1992 | Stearns | 324/537 |

Primary Examiner—Kenneth A. Wieder
Assistant Examiner—Glenn W. Brown
Attorney, Agent, or Firm—Pollock, Vande Sande & Priddy

[57] ABSTRACT

A system and a method for testing the integrity of interconnection networks on a circuit board or substrate are disclosed. To test the continuity of a being tested network, two probes are used. To test the integrity of the being tested network, as it relates to other nets on the circuit board, a rectangular pulse is provided to the being tested network, and a signal in response to the stimulus pulse, provided across an external capacitor and resistor connected to the reference plane of the circuit board or substrate, is sampled by a transient analyzer. The leading edge of the thus sampled response signal provides an indication of whether the being tested net is acceptable, opened, shorted, or has a high leakage resistance to another net.

20 Claims, 9 Drawing Sheets

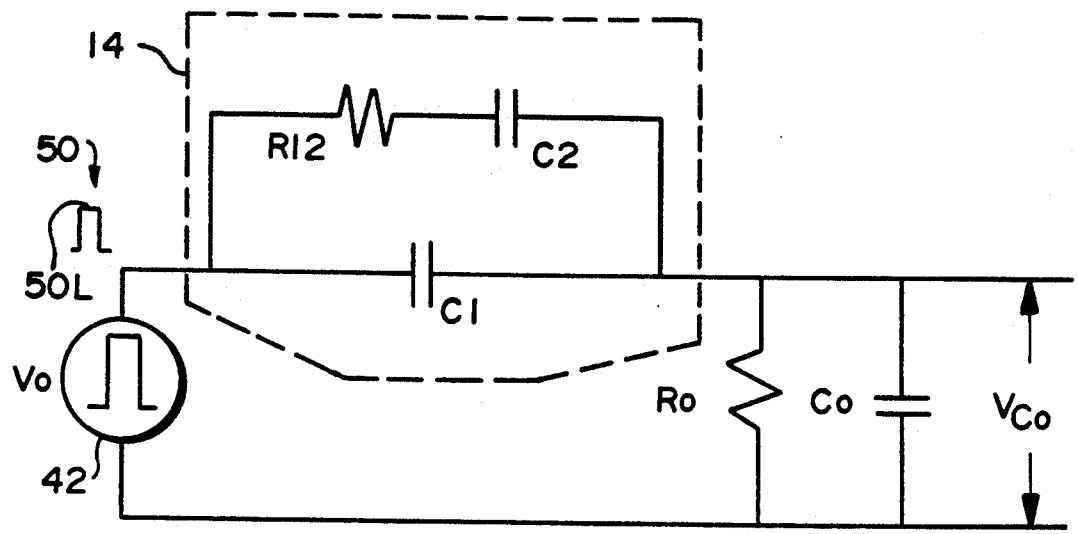
FIG. 6
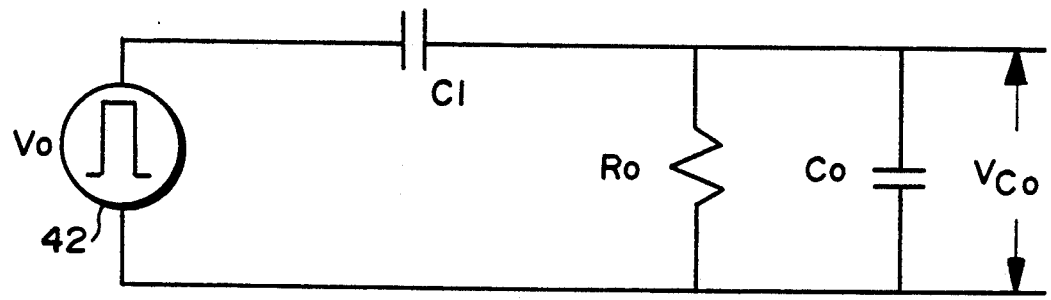
FIG. 7A
FIG. 7B
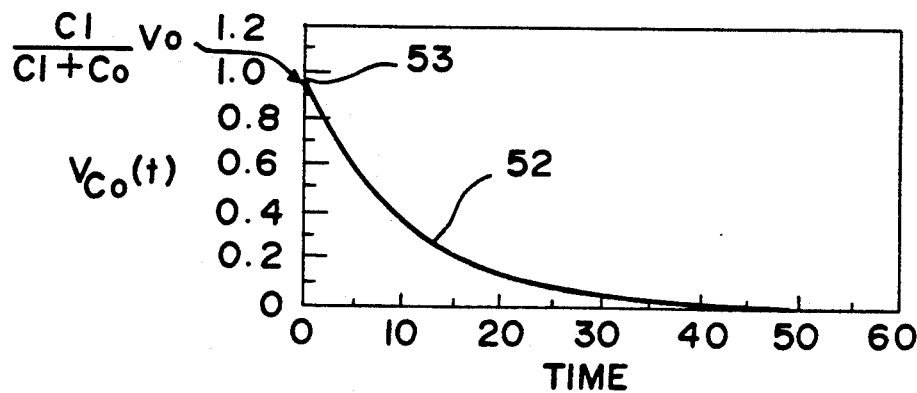

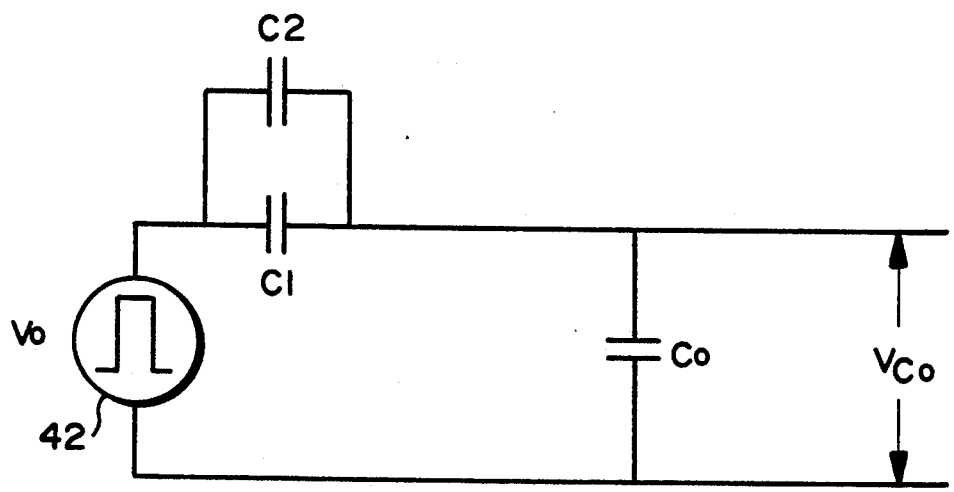
FIG. 8
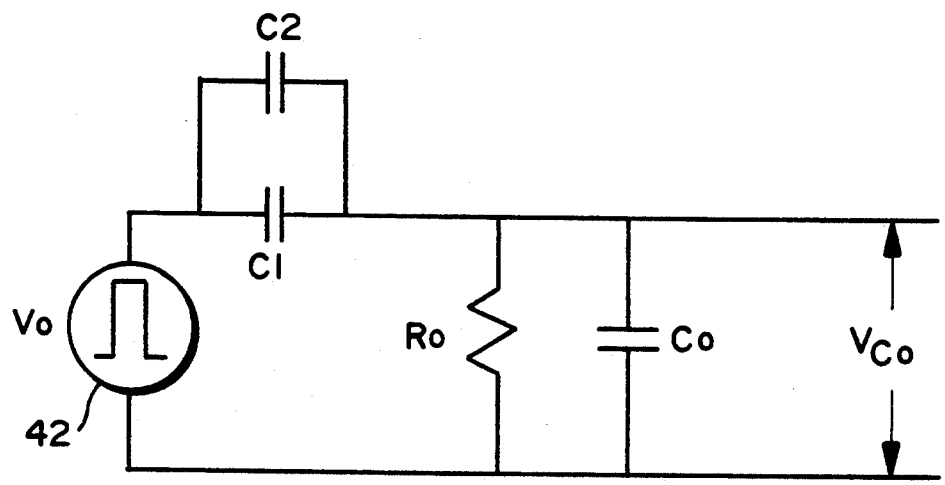
FIG. 9
FIG. 10
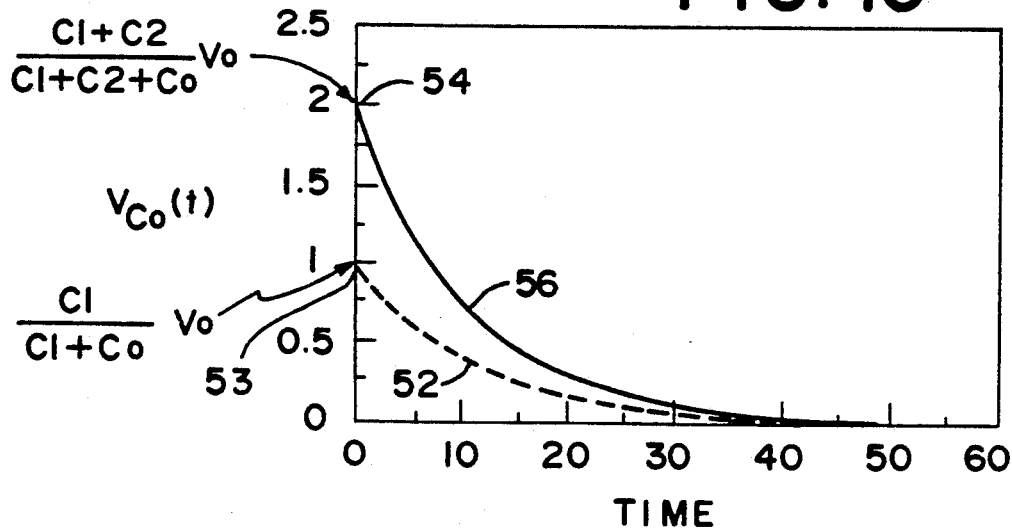

APPARATUS AND METHOD FOR RESISTIVE DETECTION AND WAVEFORM ANALYSIS OF INTERCONENCTION NETWORKS

FIELD OF THE INVENTION

The present invention relates to high density circuit boards and ceramic substrates, and more particularly to an apparatus and method for detecting the continuity of a interconnection network and whether such network is shorted to or has a leakage resistance to another interconnection network.

BACKGROUND OF THE INVENTION

Open and short tests are required for manufacturing high density printed circuit boards and ceramic substrates. As disclosed in co-pending application Ser. No. 843,672 filed Feb. 20, 1992 by S. W. Ching et al., assigned to the same assignee as the instant invention and which disclosure is incorporated by reference to the instant application, circuit boards and ceramic substrates (to be included hereinafter as part of circuit boards) usually include metal interconnection networks (nets), power planes, dielectric materials, and at least one reference plane. Each of such circuit boards can in fact comprise multi-layers each having fabricated thereon different nets. Each net may also be distributed across the multi-layers within a circuit board.

In view of the high density in which electronic components are packaged onto each circuit board, the integrity of each circuit board, i.e. the integrity of the different metal interconnections that effect each of the nets in the circuit board, is of paramount import. Thus, defects such as an "open circuit" condition whereby higher than expected resistance appears between certain sections of a network, or a "short circuit" condition whereby two separate nets, which theoretically should have infinite resistance therebetween, in fact appear to be shorted together, or have an unacceptable internet (leakage) resistance, are to be detected and avoided.

To perform the open and short tests, prior art systems and methods use full cluster probes (gang probes or bed-of-nails probes) or a number of moving probes (serial testing). The full cluster probe method detects opens by measuring the resistance between the terminals of the nets, and shorts by measuring the resistance between the being tested net and the rest of the nets. The serial testing method detects opens by measuring the resistance of the net, and shorts by measuring the capacitance between the net and a reference plane. Measured excess capacitance indicates that a short exists. The serial testing method uses DC resistance meters for open detection and impedance meters such as HP 4284A LCR meter for capacitance measurements.

An exemplary prior art method in which two moving probes are used to perform tests on nets is disclosed in Burr et al. U.S. Pat. No. 4,565,966. As disclosed, Burr performs a series of one point measurements of the capacitance of a network relative to a reference plane. To test the continuity of each net, a resistance measurement is effected between two probes each placed at an end point of the net. To measure excessive internal capacitance between nets, Burr uses conventional sinusoidal AC signal generating devices. See column 5, lines 65-69 of Burr.

Another exemplary method of detecting shorts based on using AC signals is disclosed in the above noted copending '672 application. There, an AC phase sensitive method for effecting capacitive determination is disclosed. To measure the continuity of each net, resistance measurement is used.

There are several drawbacks to the above noted prior art systems and methods. For one, the throughput for short detection based on an AC capacitance measurement method is slow. This is due to the fact that the use of an AC method to detect shorts via capacitance measurement requires that $\omega R_i C_n$ (a quantative relationship) be less than or equal to unity. ($\omega$ is the angular frequency, $R_i$ the leakage resistance between the nets, and $C_n$ the capacitance of the net to which the being tested net is shorted.) For high leakage resistance, the unity criterion requires that low frequencies be used. So, too, the AC phase sensitive detection method requires that the time constant be set to at least one period of the AC signal. And since the rise time of the AC signal, or more precisely the response thereto, is an exponential function, an input signal having a long duration is required in order to produce a substantially accurate final value.

To isolate defects, the prior art methods (not including the copending '672 invention) would match the capacitance value of the nets that are shorted with nets that have similar capacitance values. Such defect isolation methods fail to take into account the leakage resistance that occurs between nets.

As was noted previously, the threshold of the prior art method (not counting copending '672 invention) is set by the relationship $\omega R_i C_n < 1$. Since frequency f ($\omega = 2\pi f$) is the product of $R_i C_n$, $R_i$ being the definition of short and $C_n$ being the highest possible value of net capacitance in the product, overkills for low capacitance nets result. For example, if the frequency f were to depend from a threshold definition based on a short of a 100 kohms multiplied with a 50 pF net, the prior art method would interpret a net of 1 pF (net to reference plane) and 5 megohms leakage resistance to be a short because its $R_i C_n$ value is the same as the threshold value set for the definition of short $R_i$ and the maximum capacitance $C_n$.

If the relationship $\omega R_i C_n < 1$ is not satisfied, either it would be an escape or the measured capacitance is not the combined capacitance of the net under test and the net to which it is shorted. In the latter case, there would be a problem in isolating the short.

SUMMARY OF THE INVENTION

To test the integrity of a net, both in terms of its continuity and whether it is shorted to one of the other nets of a circuit board (substrate), the present invention system uses a combination resistive detection and waveform sampling. To test the continuity of a net, two probes, placed at corresponding end portions of the net, are used to measure the resistance therebetween. To detect whether the net is shorted to any of the other nets, and to isolate the net to which it is shorted if there is indeed a short, the present invention further includes the addition of an external capacitor and an external resistor (connected in parallel to the external capacitor) to the reference plane of the circuit board and the application of a rectangular pulse, from a pulse generator, to one of the probes to stimulate (stress) the net. The response from the net is then sampled across the external capacitor as a series of voltage values over time by a transient digital analyzer. The leading edge of the signal across the external capacitor, which can be extrapolated from the series of voltage values, is reflective of the integrity of the net (i.e. a good net, an open, a short, or has leakage resistance between nets) and thereby the integrity of the circuit board.

It is therefore an objective of the present invention to provide a high throughput circuit board testing system.

It is a further objective of the present invention to provide a circuit board testing system that can simultaneously effect a resistive determination of a being tested net and a waveform analysis to determine whether the net is shorted to any of the other nets on a circuit board.

It is yet another objective of the present invention to provide a circuit board testing system that can isolate a particular net to which a being tested net is shorted by determining the leakage resistance from the being tested net to the shorted net, and/or the combined capacitance of the net being tested and the shorted net and the reference plane.

BRIEF DESCRIPTION OF THE FIGURES

The above-mentioned objectives and advantages of the present invention will become apparent and the invention itself best understood by reference to the following description of an embodiment of the invention taken in conjunction with the accompanying drawings, wherein:

FIG. 6 is an equivalent circuit of the FIG. 4 system in which the small capacitance between nets is ignored;

FIG. 7A is a schematic of an equivalent circuit of the FIG. 4 system which shows a good net;

FIG. 7B is a graph illustrating the output from the FIG. 7A circuit as a function of time;

FIG. 8 is a schematic of an equivalent circuit of the FIG. 4 system which shows a low resistance or dead short;

FIG. 9 is a schematic of an equivalent circuit for $t > 0$ of the FIG. 4 system showing a low leakage resistance between the being tested net and the net to which it is shorted;

FIG. 10 is a composite graph illustrating response signals across the external capacitor of the FIG. 4 system indicating whether the being tested net is a good net, or a dead short to another net;

DETAILED DESCRIPTION OF THE PRESENT INVENTION

Figure 1:
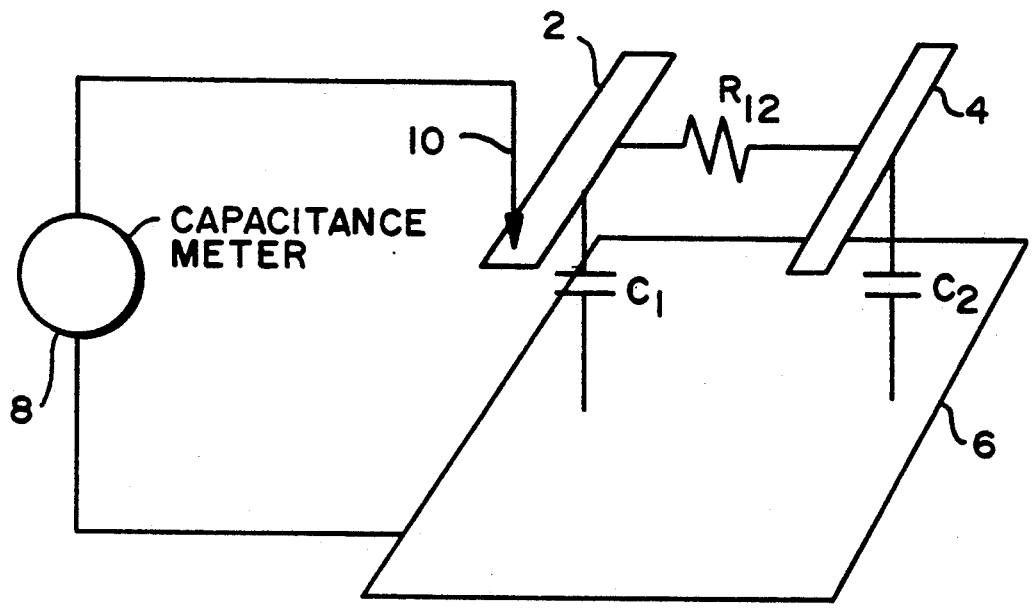
FIG. 1 is a simplified illustration of a prior art system for measuring shorts between nets on a circuit board.

With reference to FIG. 1, the prior art system and method of detecting shorts of a being tested net 2 to any other net of a circuit board is shown. As illustrated, the circuit board has a reference plane, or a power plane, 6. For the single probe system of FIG. 1, reference plane 6 can be external or internal, as in a substrate that has multiple layers each of which may contain multiple nets. Each of the nets, as for example net 2, has a certain area which depends on the width and the length thereof. Accordingly, between net 2 and reference plane 6 there is a corresponding capacitance $C_1$. Between net 2 and net 4 there is a resistance $R_{12}$. Further, there is a capacitance $C_2$ between net 4 and reference plane 6. To test for shorts, the prior art method locates a capacitance meter 8, one end of which connected to reference plane 6 while the other end to a probe 10, at one of the end points of net 2.

If there is a short between net 2 and some other net, say net 4, the capacitance measured across probe 10 and the reference plane will be greater than expected. For the prior art method, therefore, if excess capacitance is found between the being tested net and the reference plane, it is assumed that there is a short between the being tested net and some other net.

Figure 2:
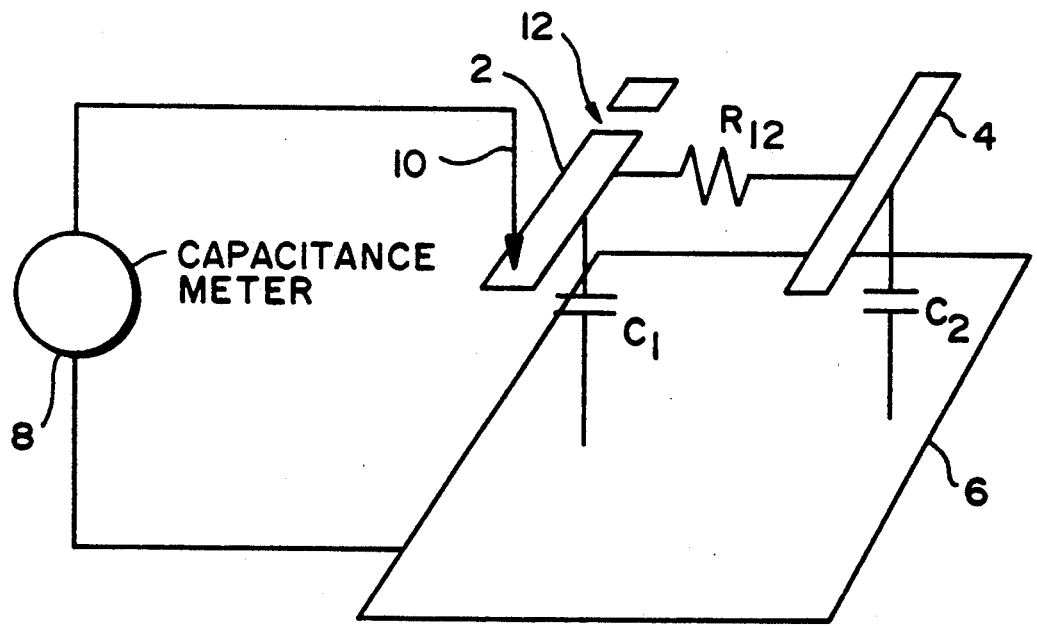
FIG. 2 is a simplified schematic of the FIG. 1 prior art system in which the being tested net has a discontinuity.

On the other hand, with reference to FIG. 2, if there is discontinuity at net 2, as for example, due to a break such as 12, the capacitance measured between probe 10 and reference plane 6 would be less than what is expected, as the area of net 2 is less than what it should be. Accordingly, for the prior art method, if there is less capacitance than expected, it is assumed there is an open at the being tested net.

Since most capacitance meter, such as 8, utilizes an AC measurement, the frequency of the AC signal has to be carefully selected in order to determine whether there are opens/shorts by measuring the capacitance. In other words, the prior art measurement is frequency dependant. Furthermore, since the respective resistance values for the definition of open and short circuits are very likely to be different, in order to test for both open and short circuits with different cut-off resistance values of open and short, different frequencies have to be used.

Figure 3:
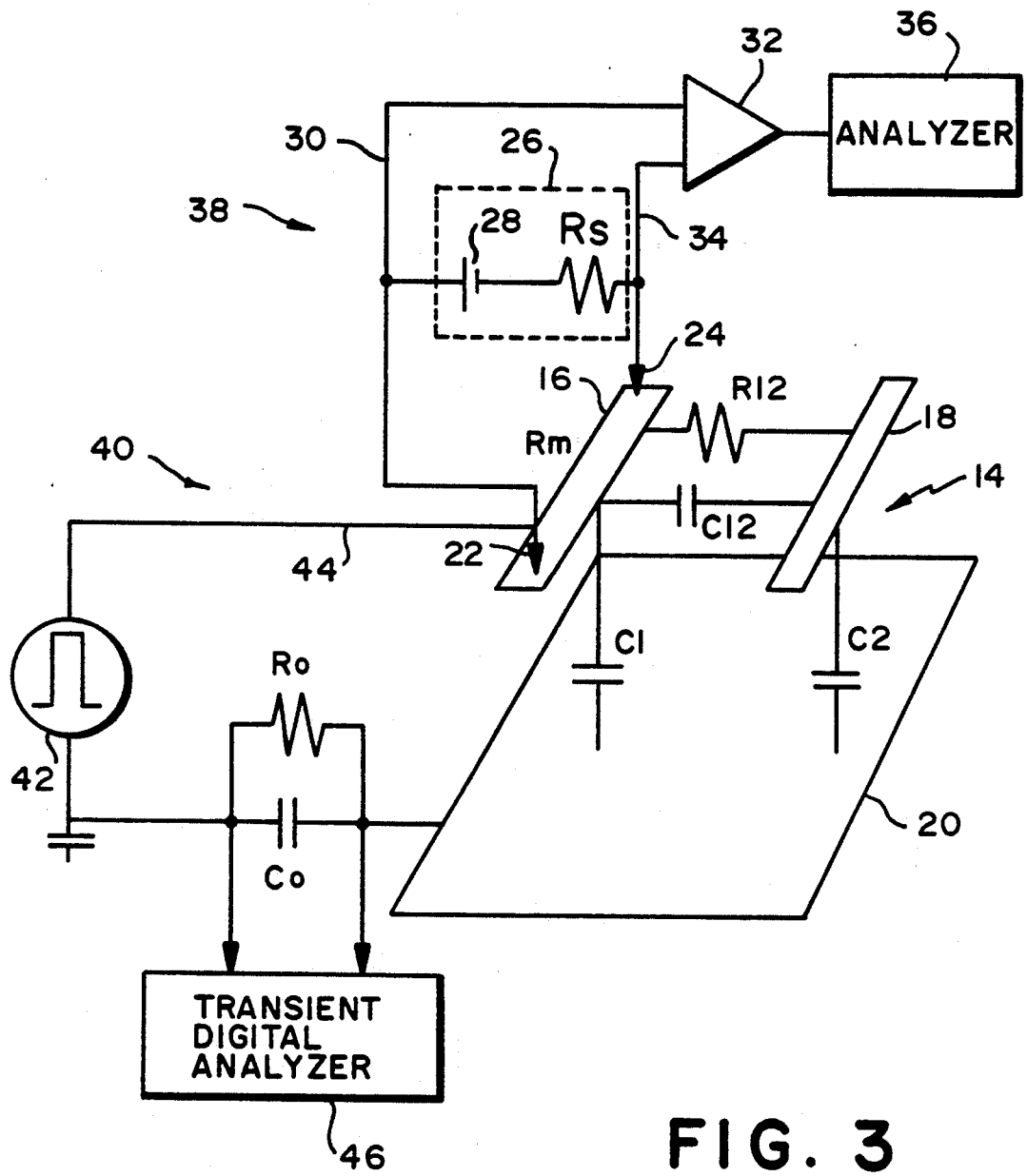
FIG. 3 is a schematic of the present invention system illustrating simultaneous resistive detection and waveform sampling.

Refer to FIG. 3 where a schematic of the present invention system is illustrated. As shown, a unit under test (UUT) 14 which comprises nets 16, 18 and reference plane 20 is subjected to resistance detection and waveform sampling. UUT 14 may in actuality be comprised of a single circuit board with a external reference plane such as 20, or a substrate having a multiple number of layers of which reference plane 20 may be an internal power or ground plane or external reference plane. In any event, a plurality of nets, of which only 16 and 18 are shown, may be fabricated on each of the layers.

The being tested net 16 has positioned at respective end portions thereof a first probe 22 and a second probe 24. Probes 22 and 24 together perform the resistive continuity test to determine whether there is any break at net 16. The circuit to which probes 22 and 24 are part of may be referred to as a floating current testing circuit 38. In addition to probes 22 and 24, the floating current testing circuit 38 also includes a floating current source 26. The floating current source can be a floating voltage source 28 and a resistance $R_s$. An output of probe 22 is connected via line 30 to one of the inputs of a differential amplifier 32, and the output of probe 24 is connected via line 34 as the other input to differential amplifier 32. Floating current source 26 is connected across lines 30 and 34. The output of differential amplifier 32 is detected by an analyzer 36 which, for the embodiment of the present invention, may be an Analytek transient digital analyzer having model number 2000P.

Floating current testing circuit 38 detects the resistance between any two points, as for example the distance separated by probes 22 and 24, along net 16. Such resistance is designated $R_m$. In essence, if there is proper conductivity between any two points, as designated by probes 22 and 24 for example, along net 16, the resistance, if any, between those points is very low. Conversely, if there is improper conductivity, i.e. discontinuity, between any two points along net 16, for example as a result of physical breakage, the resistance between those points are extremely high, as for example, almost infinite. Thus, by determining the resistance between the various points, and particularly the end points, along net 16, its conductivity can be ascertained.

For floating current testing circuit 38, in operation, probes 22 and 24 are each brought into contact with net 16 at respective different locations, for example its respective end points. A small current is then provided by floating current source 26 to one of the probes, as for example probe 24. The current in net 16 induces voltage potentials at probes 22 and 24 which are sampled by differential amplifier 32. If the resistance of net 16 is low, differential amplifier 32 would detect substantially no potential difference between the different locations. However, if the resistance of net 16 is high, differential amplifier 32 would detect a potential difference between probes 22 and 24, which in turn is detected by analyzer 36. Thus, by detecting the potential difference provided from differential amplifier 32, the conductivity of net 16 is ascertained.

Figure 4:
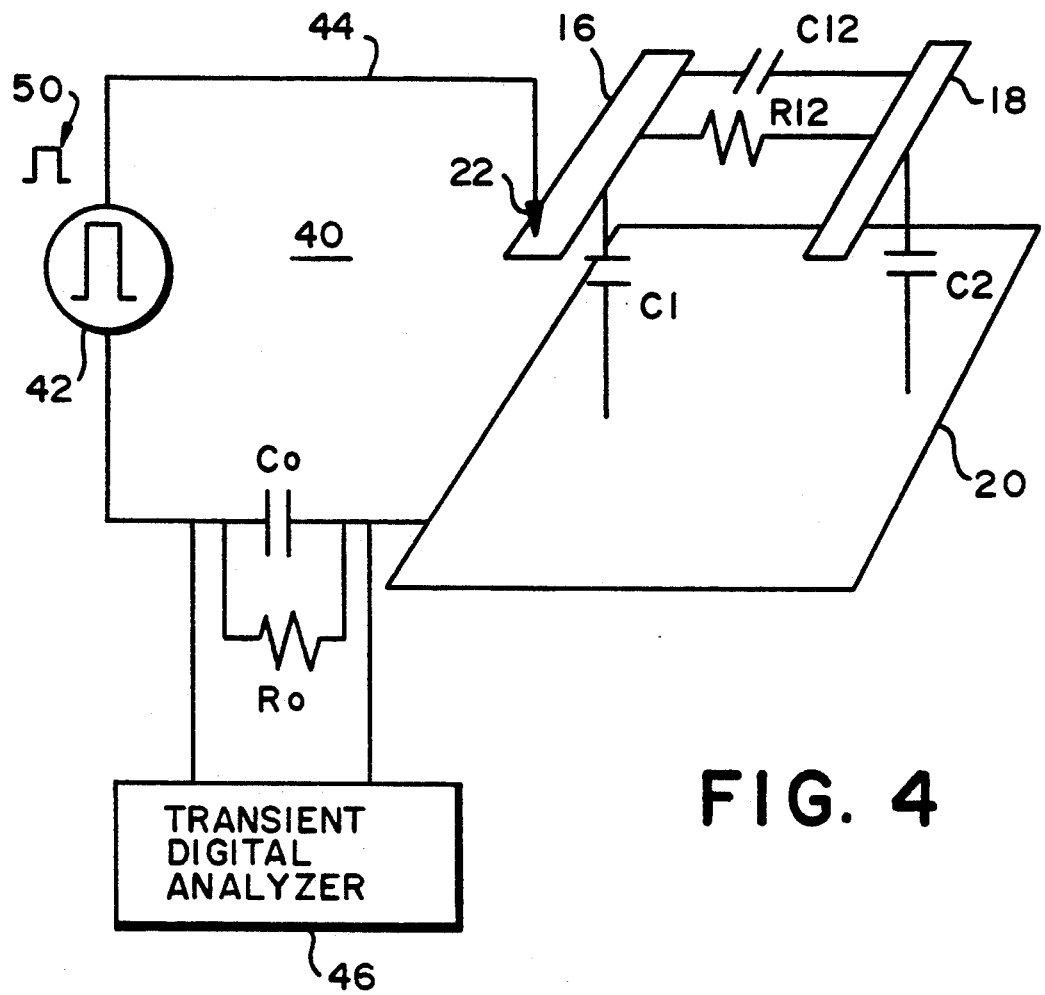
FIG. 4 is a schematic illustrating only the short detection portion of the present invention.

The present invention of FIG. 3 has a second circuit, which may be referred to as short testing circuit 40, shown separately in FIG. 4. Continuing with FIG. 3, short detecting circuit 40 comprises a probe, for example probe 22, an internal resistance $R_{12}$ across nets 16 and 18, an internal capacitance $C_{12}$ across nets 16 and 18, a capacitance $C_1$ across net 16 and reference plane 20, and a capacitance $C_2$ between net 18 and reference plane 20. There is further included in short testing circuit 40 an external capacitor $C_0$ one end of which is connected to reference plane 20 and the other end of which is connected to a pulse generator 42, which may be grounded. Pulse generator 42 has an output provided via line 44 to probe 22. There are a number of pulse generators which may be used for the embodiment of the present invention shown in FIG. 3. One of such commercially available pulse generators is made by the Berkeley Nucleonics Corp., known commonly as BNC model number 202H. Briefly, pulse generator 42, as its name implies, generates pulse signals whose width can be varied. Connected across $C_0$ is an analyzer 46 which may also be an Analytek 2000P transient digital analyzer.

With reference to FIG. 4, short detecting circuit 40 operates as follows. A rectangular pulse, designated 50, is generated from pulse generator 42 and fed via line 44 to probe 22, which could be placed anywhere along net 16. The width and amplitude of the pulse are dependent on the combined characteristics of the different electronic components in the circuit and particularly are dependent on the type of sensitivity required for the circuit and the signal/noise level that is desired. In other words, the higher the required sensitivity for large leakage resistance, the wider the width. So, too, the larger of a signal/noise level desired, the larger the amplitude of the pulse signal.

In any event, the pulse signal is applied by probe 22 to net 16. Depending on the different values of $C_{12}$, $R_{12}$, $C_1$ and $C_2$, signals having different amplitudes are produced across external capacitor $C_0$. An exemplar response signal is shown, for example, in FIG. 7B. The interpretation of the response signal is described later with respect to the different equivalent circuits of FIGS. 5–13. For now, suffice it to note that the signal across external capacitor $C_0$ is sampled by transient digital analyzer 46 as discrete values over time (i.e. waveform sampling), and that $C_0$ creates a "loading" effect which causes the initial sampled values, i.e. at or about $t=0$, to have different values (amplitudes) for different nets (assuming different nets have different characteristics). Thus, by studying the initial sampled values of the response signal, a quick determination can be made on whether a net is acceptable, i.e. a good net, an opened net, shorted to one of the other nets on the circuit board, or has a leakage resistance to one of the other nets.

For the schematic circuit shown in FIG. 4, in terms of definition, in addition to external capacitor $C_0$, there is an external resistor $R_0$ connected across $C_0$. $C_1$ refers to the capacitance between net 16, i.e. the being tested net, and reference plane 20. $C_2$ is defined as the capacitance between net 18, i.e. a net to which the being tested net is shorted, and reference plane 20. $C_{12}$ is the coupling capacitance between the being tested net and the net to which it is shorted, i.e. between net 16 and net 18. $R_{12}$ is the leakage resistance between the being tested net, i.e. net 16, and the net to which it is shorted, i.e. net 18. $R_0$ and $C_0$ are chosen so that $R_0 C_0 >> R_{12} C_1$, $R_{12} C_2$ and $C_0 >> C_1$, $C_2$.

Figure 5:
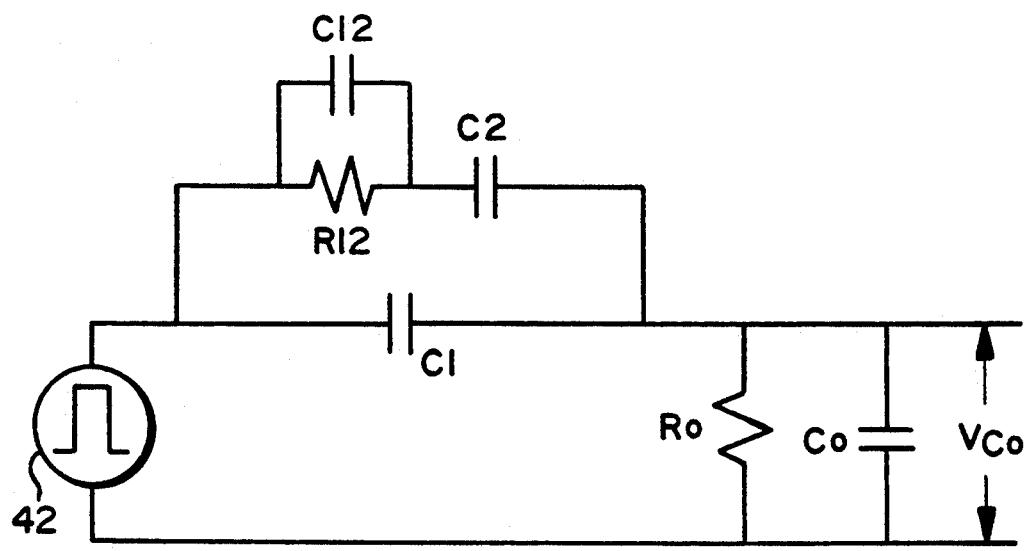
FIG. 5 is a schematic of the equivalent circuit of the FIG. 4 system.

An equivalent circuit of the FIG. 4 short detection circuit 40 is shown in FIG. 5. In general, $C_{12}$ is very small, even when all of the nets of the circuit board electrically coupled to the being tested net are summed. Putting it differently, $C_{12}$ is much smaller than either $C_1$ or $C_2$. Thus, $C_{12}$ can be ignored. Consequently, the FIG. 5 circuit becomes that shown in FIG. 6.

As shown in FIG. 6, the dotted box represents UUT 14, and includes $R_{12}$, $C_2$ and $C_1$. With reference to FIG. 4, if net 16 is a good net, the resistance of $R_{12}$ is at least about $10^{12}$ ohms.

The following is a basic conceptual qualitative analysis of the equivalent circuits of the present invention system.

In FIG. 6, it can be seen that at $t=0$, a pulse generated, by pulse generator 42, designated 50, has a leading edge 50L. With focus to UUT 14, at $t=0$, $C_1$ and $C_2$ behave like shorts. And for the instance where the being tested net, for example net 16 in FIG. 4, is acceptable or is a good net, $C_2$ is not a factor, as there is no short between net 16 and net 18. Consequently, the FIG. 7A equivalent circuit results.

With reference to FIG. 7A, at t=0, $R_0$ is shorted by $C_0$, the external capacitor. Accordingly, Equation 1 results.

$$V_{C1} + V_{C0} = V_0 \tag{1}$$

By manipulating Equation 1, the following expression represented by Equation 2 is obtained.

$$V_{C0} = \frac{C_1}{C_1 + C_0} V_0 \tag{2}$$

Equation 2 represents the amplitude of the voltage value measured across $C_0$, the external capacitor, at t=0. In other words, in response to leading edge 50L of pulse 50 being applied from pulse generator 42, the amplitude of the responsive signal across $C_0$ for the FIG. 7A circuit is represented by Equation 2. This amplitude is shown at t=0 in the graph of FIG. 7B. At t >0, the responsive signal across $C_0$ becomes an exponentially decaying waveform, as represented by the portion of the FIG. 7B graph designated 52, which has at time constant of $R_0(C_1+C_0)$. Taking into consideration the exponential decay portion of the signal, at t>0, Equation 3 is obtained.

$$V_{C0} = \frac{C_1}{C_1 + C_0} V_0 e^{-(R0 \frac{t}{(C_1+C_0)})} \tag{3}$$

It should be appreciated that Equation 2 is the same as Equation 3 when the exponential term goes to 1 at t=0.

For the present invention embodiment, $V_{C0}$ of Equation 2, is reflective of the value of a good net which may be obtained, for example, from predetermined product design values or determined empirically. For example, given the fact that the respective values of external capacitor $C_0$ and the amplitude of input pulse $V_0$ (i.e. leading edge 50L) are known, a predetermined product design value of $V_{C0}$ could be calculated by using Equation 2. Another approach is to determine $V_{C0}$ empirically by measuring a number of good parts. Therefore, with reference to FIG. 7B, the value $V_{C0}$ obtained from any being tested net, as compared to its predetermined value, if found to be at point 53, would be considered a good net. Conversely, any $V_{C0}$ values across external capacitor $C_0$ different from point 53 (allowing for process variation and measurement uncertainty) would not be a good net. Rather, such nets would be considered as either having an open, shorted to another net on the circuit board or has high leakage resistance to another net. As shown in FIG. 7B, once external resistor $R_0$ comes into play, the voltage values across external capacitor $C_0$ begin to decay, per downward slope waveform designated 52.

As noted above, if the resistance separating the being tested net, for example net 16, and any other net on the circuit board, for example net 18, is small, there is a low resistance short, which may be referred to as a low leakage resistance. The equivalent circuits for such low leakage resistance are shown in FIGS. 8 and 9. FIG. 8 illustrates the equivalent circuit at t=0, whereas FIG. 9 illustrates the equivalent circuit after t>0, when external resistor $R_0$ becomes a part of the circuit.

Given the equivalent circuit of FIG. 8 at t=0, the hereinbelow equation 4 is obtained.

$$V_{C0} = \frac{C_1 + C_2}{C_1 + C_2 + C_0} V_0 \tag{4}$$

Thereafter, at t>0, external resistance of $R_0$ becomes a factor. This results in Equation 5.

$$V_{C0} = \frac{C_1 + C_2}{C_1 + C_2 + C_0} V_0 e^{-(R0 \frac{t}{(C_1+C_2+C_0)})} \tag{5}$$

As should be appreciated, at t=0, the exponential portion of Equation 5 becomes 1 to thereby yield Equation 4. Accordingly, Equation 4 represents the situation where the being tested net, for example net 16, is shorted to any one of the nets, for example net 18, on the circuit board. For the instant invention, the voltage value $V_{C0}$ across $C_0$ represented by Equation 4 is designated at point 54 in the graph of FIG. 10 and can be referred to in the instant invention as a "dead short". Putting it simply, the being tested net is determined to be directly shorted to another net on the circuit board. Immediately after t=0, as $C_2$ begins to charge, $C_0$ begins to discharge, and $R_0$ being a factor, the exponential portion of Equation 5, represented by the waveform designated 56 in FIG. 10, takes on the time constant $R_0$ ($C_1+C_2+C_0$).

With regard to both the good net value, at 53, and the dead short value, at 54, do note that both values correspond to voltage amplitudes at t=0. Thus, if a pulse of a certain amplitude is applied to a being tested net, at substantially t=0, the amplitude (value) of the voltage across the external capacitor $C_0$ would reflect whether the being tested net is a good net, completely shorted to some other net, or has a high leakage resistance to another net in the circuit board. Inasmuch as the present invention is able to determine at t=0 whether the being tested net is a "good net" or a "dead short", it is in sharp contrast to the prior art methods where capacitance meters are used. Such prior art methods require the transient voltage to die down before an accurate measurement can be taken. Consequently, the present invention system has a much greater throughput than the prior art systems.

If the value across the external capacitor C0, at t>0, is in fact deemed to fall somewhere between the predetermined value of a good net and the threshold value of a dead short, as for example between points 53 and 54 in FIG. 10, such high leakage resistance between the being test net and the net to which it is shorted can be deduced per the analysis given hereinbelow.

Figure 11:
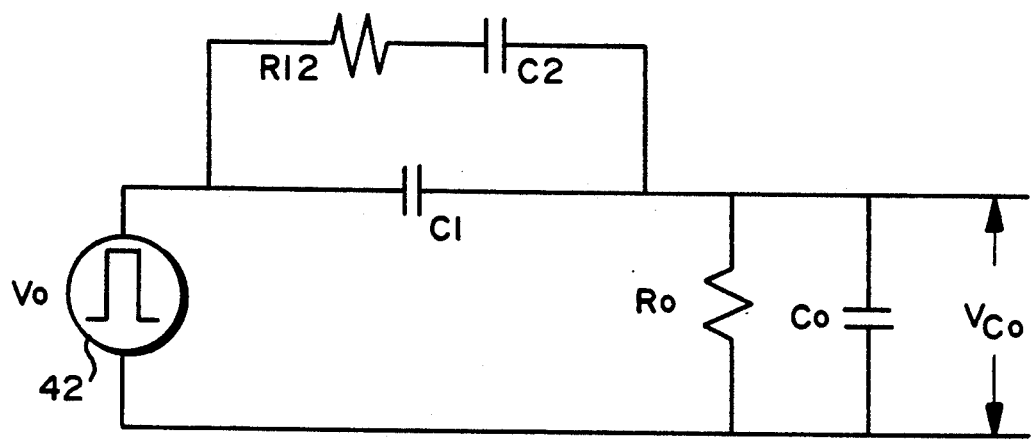
FIG. 11 is an equivalent circuit of the FIG. 4 system of the present invention for illustrating high leakage resistance analysis.

For the high leakage resistance analysis, resistance $R_{12}$ between the being tested net and the net to which it is shorted is, by definition, high, i.e. a net to net high leakage resistance. Consequently, the present invention system of FIG. 4 is reduced to the equivalent circuit of FIG. 11. There, net to net resistance $R_{12}$ is part of the circuit. At t=0, however, $R_{12}$ and $C_2$ are shorted by $C_1$. At the same time, $R_0$ is shorted by $C_0$. The circuit of FIG. 11 is thus reduced to the equivalent circuit of FIG. 12, which in turn is the same as the equivalent circuit of a good net, as shown in FIG. 7A. The equation derived from the FIG. 12 circuit, at t=0, is therefore the same as Equation 2.

Figure 13:
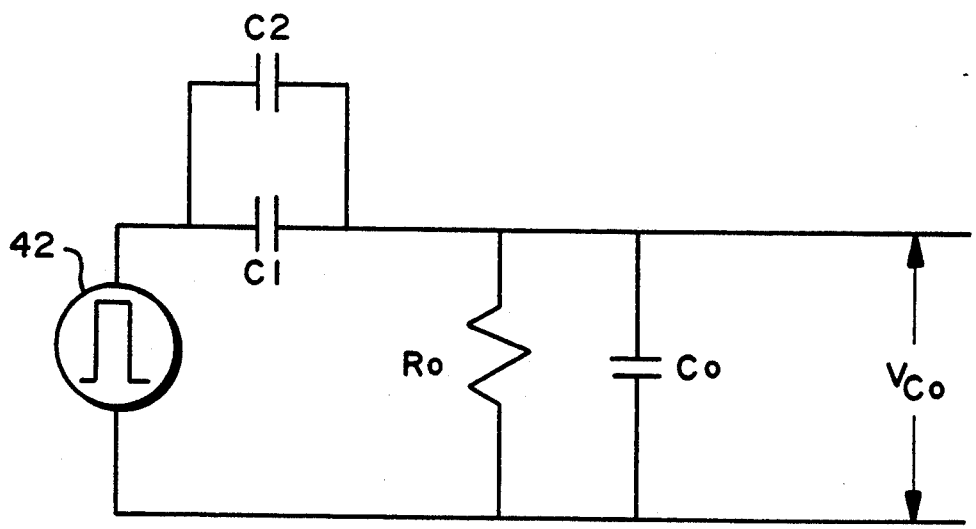
FIG. 13 is an equivalent circuit of the FIG. 11 circuit in which external resistance $R_0$ comes into play after $t > 0$.

Immediately after t=0, $C_2$ begins to charge while $C_0$ begins to discharge, as resistance $R_0$ becomes a factor in the circuit. This equivalent circuit is shown in FIG. 13 which, not surprisingly, is the same as that shown in FIG. 9. Thus, once $C_2$ is completely charged, an equation which is the same as that of Equation 5 is derived from the FIG. 13 circuit.

Figure 12:
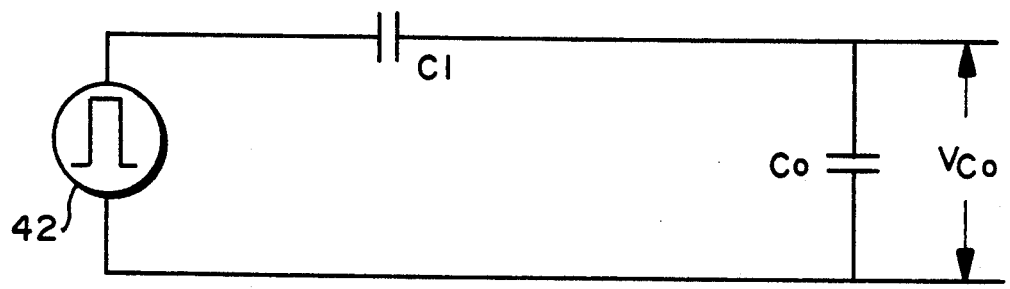
FIG. 12 is an equivalent circuit of the FIG. 11 circuit in which the resistance of the FIG. 11 circuit has been ignored at $t = 0$.
Figure 14:
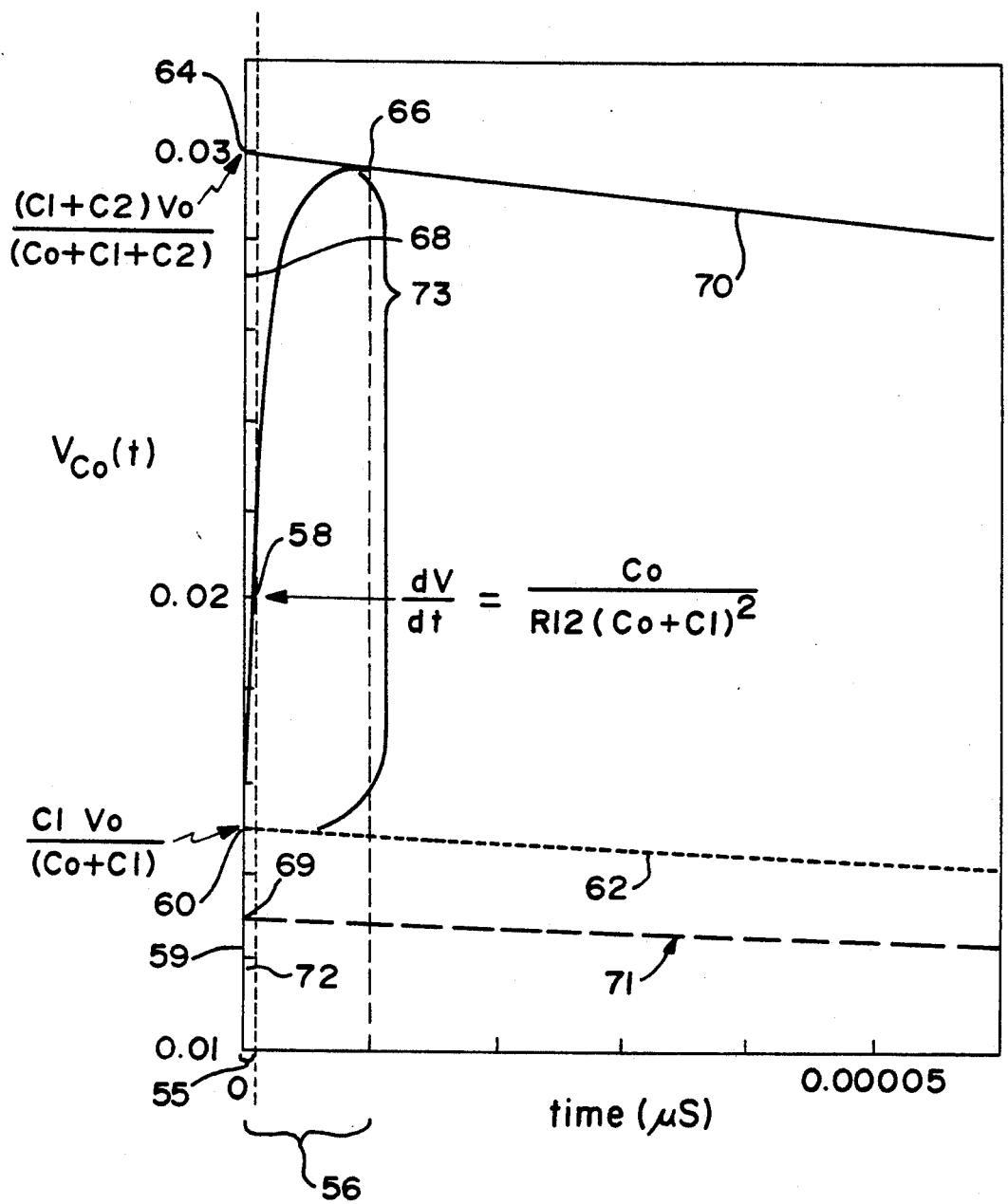
FIG. 14 is a composite graph showing a good net, an open net, a dead short, and the high leakage resistance therebetween.

The fact of a being tested net having a high leakage resistance shorted to another net on the circuit board, as demonstrated in the equivalent circuits of FIGS. 11-13, is further illustrated in the graph of FIG. 14.

FIG. 14 is a graph which has superimposed thereonto the respective waveforms of a good net, an open net, a dead short and a short with high leakage resistance. As was discussed previously, the waveforms of a good net, an opened net, a dead short and a high leakage resistance short are based on a predetermined value in accordance with the known values of external capacitor $C_0$ and the value of input pulse $V_0$. The good net waveform is represented in FIG. 14 by a substantially vertical portion 59, at $t=0$ that rises to point 60 (which is the predetermined product design value and point 53 in FIG. 10) and then slopes downwards ever so slightly along straight line 62. An opened net waveform is represented in FIG. 14 by a substantially vertical portion 72 at $t=0$ that rises to point 69 (which is below point 60) and then slopes downward ever so slightly along straight line 71. The dead short waveform is represented in FIG. 14 by a substantially vertical portion 68, at $t=0$, that rises to point 64 (which is above point 60) and then slopes downwards ever so slightly along straight line 70. The high leakage resistance short waveform comprises a rising portion 58, which is the same as 59 up to good net point 60, that rises until it begins to slope downwards along straight line 70 which, if extrapolated back to $t=0$, is the same as the dead short point 64 (54 in FIG. 10). From the graph of FIG. 14, therefore, it is not too surprising that the circuits shown in FIGS. 12 and 13, and their corresponding equations, are the same as those of FIGS. 7A and 9. For as shown, rising edge 68 of the dead short waveform is the same as rising edge 59 of the good net waveform, until point 60. Further, if its downwards slope portion 70 is extrapolated in time back to $t=0$, it coincides with the dead short point at 64.

Between the downwards slope portion 62 of the good net waveform and the downwards slope portion 70 of the dead short waveform there is a portion 73, which represents the high leakage resistance between a being tested net and the net it is shorted to. The mathematical equation representing portion 58 is set forth in equation 6.

$$\left.\frac{dV}{dt}\right)_{t=0} = \frac{C_0 V_0}{R_{12}(C_0 + C_1)^2} \quad (6)$$

where $$\left.\frac{dV}{dt}\right)_{t=0} =$$

change of voltage value as a function of time at $t=0$.

With reference to the graph of FIG. 14, the operation of the present invention system is as follows. Assume a predetermined value for a good net is at 60, and the threshold of what constitutes a dead short is above point 60 (such as point 64). To evaluate a net, a rectangular pulse that may have, for example a width of 200 μsec, is provided to the net, via generator 42 and probe 22 (see FIG. 4). The response across external capacitor $C_0$, as a waveform of discrete voltage values over time, is sampled by transient digital analyzer 46 and stored in a memory, such as memory 76M shown in FIG. 16. Of course, it should be appreciated that the rectangular pulse being applied to the being tested net can also be used to stress test the same.

To analyze what was sampled at or about $t=0$, which for purpose of explanation is equivalent to the time period designated 55 in FIG. 14, the voltage values across $C_0$ are evaluated to determine whether they are rising, have reached a high point, or are sloping downwards. In the case of a good net, as shown in FIG. 14, the voltage values sampled over time would reach point 60 and then slope downwards along straight line 62. It should be appreciated that straight line portion 62 is, in actuality, part of the waveform that slopes downwards exponentially, per portion 52 shown in FIG. 10. Yet for the graph of FIG. 14 where the time unit of measurement is small, a downwards sloping straight line approximation is perfectly justified. In the case of a net that is shorted to another net, as shown in FIG. 14, it is clear that the sampled voltage values would continue to rise beyond point 60. Therefore, given the period designated 55, i.e. approximately at $t=0$, the present invention system can determine quite accurately and quickly whether a being tested net is good or shorted.

Continuing with the analysis, assuming the width of a stimulus pulse to be 200 μsec, the response across $C_0$ would accordingly comprise a waveform, sampled (by transient digital analyzer 46) as a series of discrete voltage values through a 200 μsec period of time. As noted previously, the thus sampled values are recorded in memory 76M of the signal acquisition and digitizing system 76 (see FIG. 16).

To determine the integrity of the being tested net, an evaluation is next made, based on a subportion of the recorded voltage values. For example, an of interest period such as 56 shown in FIG. 14 is evaluated to determine whether the rising edge 58 of the response signal waveform is sloping upwards; and if it is, it has high leakage resistance. The leakage resistance can be calculated from the initial slope. Using a different (later) subportion of the recorded voltage values, region 73, the combined capacitance of the net under test and the net shorted to can be deduced. If the rising edge 58 of the response signal is sloping downwards, it is either a good net, dead short or an open net. In this case, the $V_{C0}$ value at $t=0$ is deduced by extrapolating the subportion at the recorded voltage values. If the extrapolated $V_{C0}$ value at $t=0$ is at its expected value, it is a good net. If the extrapolated $V_{C0}$ value at $t=0$ is above its expected value, it is a dead short. If the extrapolated $V_{C0}$ value at $t=0$ is below its expected value, it is an open net.

In sum, therefore, to determine the integrity of a being tested net, discrete voltage values as a function of time in response to a stimulus pulse are sampled across external capacitor $C_0$. Those sampled values are stored in a memory. The initially sampled values can readily be used to quickly determine whether the being tested net is good or shorted. A subset of the stored values is then evaluated for a given of interest period. And by approximating the of interest period as a straight line, the measured values can be extrapolated back to $t=0$ to thereby deduce, or confirm, whether the being tested net is a good net, an opened net, shorted to another net, or has a high resistance to another net. (Given the fact that the values of the components for the circuit of FIG. 4 are known, or can be preset, the values of the different capacitance and resistance can easily be ascertained.) Further, by evaluating the resistance between a being tested net and the net to which it is shorted, the latter net can easily be located, i.e. isolated. Isolation can be done by matching detected nets by their $V_{C0}$ at $t=0$ and $R_{12}$ from the list of defective nets.

Thus, the present invention system not only is capable of evaluating whether a being tested net is a "good net" or "dead short" to another net on the circuit board, it is also able to deduce the resistance between the being tested net and the net, if any, it is shorted to. Of course, the initial voltage amplitudes, as reflected by rising edge 58 of FIG. 14, is dependant on the amplitude of the rectangular pulse and the sampling rate set in transient digital analyzer 46 (i.e. whether analyzer 46 is to measure 500, 600, or 700 etc. samples in the 200 μsec period of time discussed above).

Figure 15:
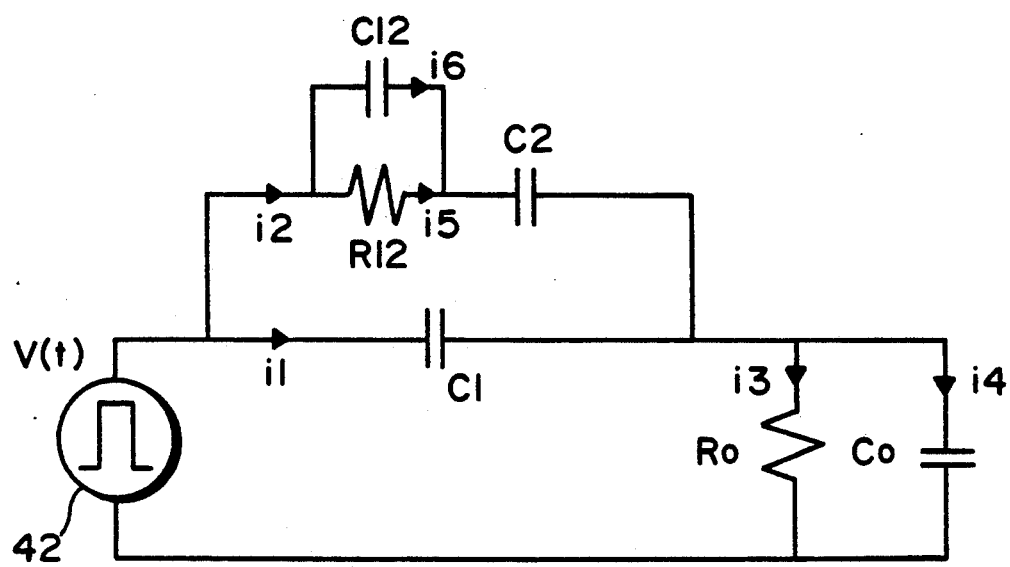
FIG. 15 is a equivalent circuit of the FIG. 4 system demonstrating different current flows through the circuit.

FIG. 15 illustrates an equivalent circuit of the FIG. 4 system in which the different currents, designated $i_1$ to $i_6$, flowing through the circuit are added. From this equivalent circuit, the hereinbelow six equations are obtained.

$$i_1(t) + i_2(t) = i_3(t) + i_4(t) \quad (7)$$

$$i_2(t) = i_5(t) + i_6(t) \quad (8)$$

$$\frac{1}{C_1} \int i_1(t)dt + i_3(t)R_0 = V(t) \quad (9)$$

$$i_5(t)R_{12} + \int \frac{i_2(t)dt}{C_2} = \int \frac{i_1(t)dt}{C_1} \quad (10)$$

$$VC_0(t) = i_3(t)R_0 = \int \frac{i_4(t)dt}{C_0} \quad (11)$$

$$i_5(t)R_{12} = \int \frac{i_6(t)dt}{C_{12}} \quad (12)$$

With 6 equations and 6 unknowns, the respective values of the different components of the FIG. 15 circuit i.e. the present invention system of FIG. 4, can be obtained. These values depend, of course, on the predetermined values of $C_0$, $R_0$ and $V_o$.

Thus, in combining the short detection circuit of the present invention system of FIG. 4 with the resistance detection circuit 38 as shown in FIG. 3, the present invention system can simultaneously perform resistance detection and waveform sampling to determine whether the being tested net is conductive and whether it is isolated from the other nets on the circuit boards. And if the being tested net in fact is determined to be shorted to one of the other nets on the circuit board, a determination can further be made on whether it is a dead short or a high leakage resistance short. Further, by being able to perform both the resistance detection and waveform sampling simultaneously and being able to determine initially whether the net is good or at t=0, the present invention system is able to perform testing with a much greater throughput than prior art systems.

Figure 16:
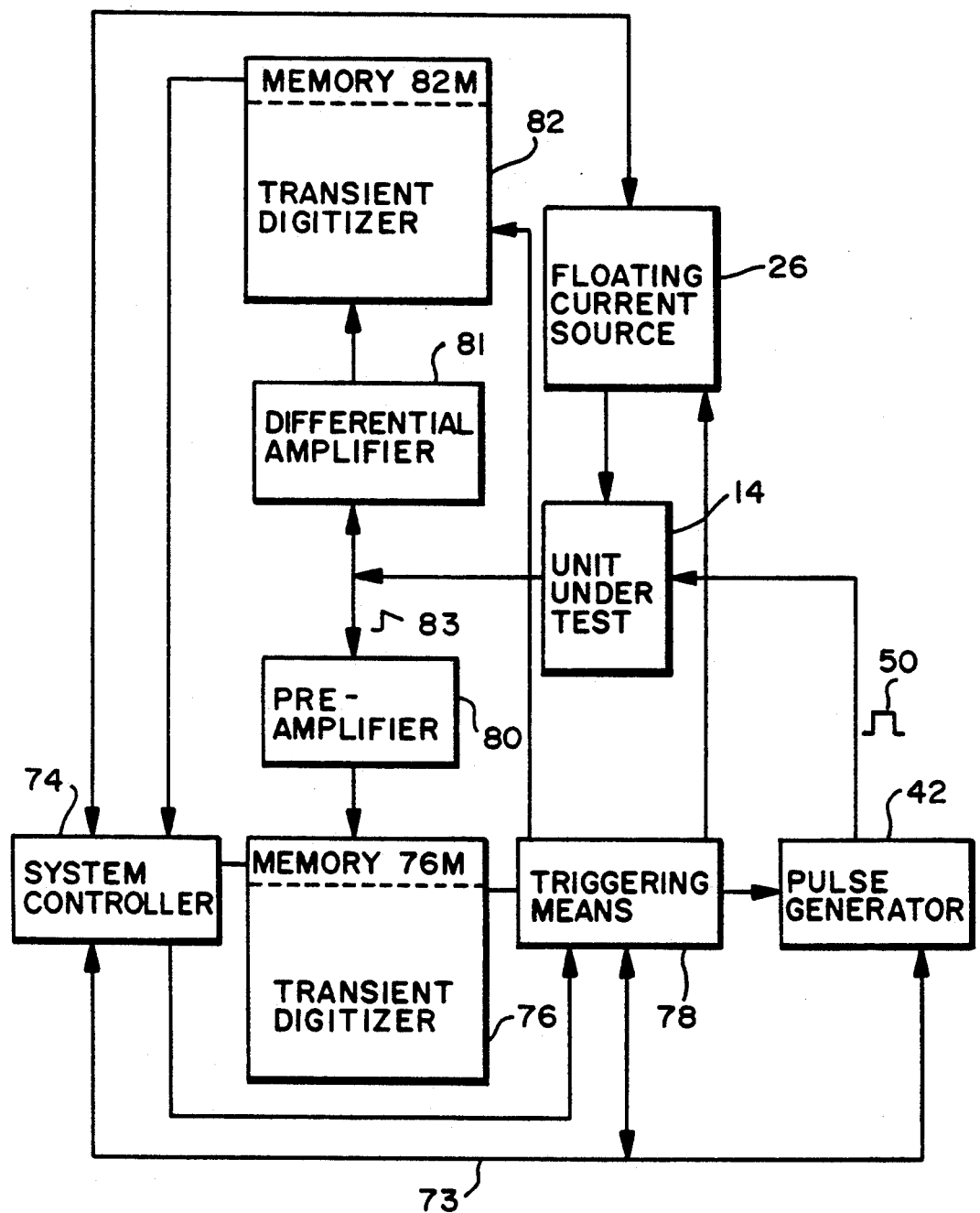
FIG. 16 is a block diagram illustrating the different components of the present invention.

The equipment utilized for the present invention system are illustrated in FIG. 16. As shown, the circuit under test (or UUT) 14 is connected to pulse generator 42. As was mentioned previously, pulse generator 42 is a Berkeley Nucleonics Corp., BNC model 202H generator. Generator 43 is connected bi-directionally to a bus 73 to which there are also connected a system controller 74, a signal acquisition and digitizing system 76, and a trigger generator 78. System controller may be a conventional 486 type microprocessor. Signal acquisition and digitizing system 76, as was disclosed earlier, comprises at least one Analytek model 2000P transient digital analyzer, and includes a memory 76M. Do note that analyzers 36 and 46 shown in FIG. 3 are a part of signal acquisition and digitizing system 76. Connected to an input of system 76 is a preamplifier 80.

System controller 74 controls the operation of system 76, trigger generator 78 and, to a certain extent, the operation of pulse generator 42 and transient digitizer 76, as well as analyzing the data to decide the integrity of the net being tested. In effect, controller 74 controls the respective operations of trigger generator 78 and pulse generator 42 and transient digitizer 76 so that trigger pulses are generated from generator 78 to cause the transient digitizer 76 to start collecting data and pulse generator 42 to output a rectangular pulse 50, via a probe, for example 22 shown in FIG. 3, to a being tested net in circuit under test 14. The responsive signal (discrete voltage values as a function of time) across the external capacitor C0, designated 83, is provided to a preamplifier 80, before being fed to and stored in memory 76M. A series of the stored values reflective of a recorded response signal for a given period, for example 100 μsec (between t=100 μsec and t=200 μsec of a 200 μsec width stimulus pulse) could be evaluated. Assuming the stored values at this 100 μsec time period form a straight line, an extrapolation back to t=0 to determine the status of the being tested net can be made. Thus, if the straight line is extrapolated back to point 60, and its slope is negative, a good net is confirmed. On the other hand, if the straight line is extrapolated back and meets point 64 (above point 60) at t=0, a dead short is confirmed for the being tested network. If the slope at point 60, t=0 is positive, the leakage resistance can be calculated from the slope. The capacitance and resistance values can be calculated using Equations 7–12. The signal can either be displayed on an oscilloscope (not shown) or stored in memory (not shown) for later evaluation by the system controller or some means, if needed.

For the resistance detection, current source 26 provides the current to the being tested net of circuit under test 14. The values of the voltage potentials are provided also to a differential amplifier 81 and recorded in memory 82M of digitizing system 82, as was discussed with respect to FIG. 3.

While a preferred embodiment of the present invention is disclosed herein for purposes of explanation, numerous changes, modification, variations, substitutions and equivalents, in whole or in part, will now be apparent to those skilled in the art to which the invention pertains. Accordingly, it is intended that the invention be limited only by the spirit and scope of the appended claims.

I claim:

1. Apparatus for evaluating a unit under test having at least one network located spatially in parallel to at least one reference plane, comprising:

means for generating a pulse;

probe means for applying said pulse to said network;

capacitive means and resistive means electrically connected to said reference plane;

analyzer means for detecting the amplitude of the leading edge of a signal across said capacitive means in response to said pulse, said amplitude being indicative of the integrity of said network.

2. Apparatus of claim 1, wherein said analyzer means comprises a transient analyzer; and wherein said amplitude of said signal detected across said capacitive means by said transient analyzer provides an indication that said network is either acceptable, opened, shorted, or has a leakage resistance to another network.

3. Apparatus of claim 2, wherein said pulse generating means comprises a pulse generator, said capacitive means comprises a capacitor and said resistive means comprise a resistor connector in parallel to said capacitor; and wherein said analyzer means uses respective values of said pulse and said capacitor to calculate said leakage resistance.

4. Apparatus of claim 1, wherein said signal comprises a series of discrete values; said apparatus further comprising:

a memory means for storing said series of discrete values.

5. Apparatus of claim 4 further comprising another analyzer means for measuring the resistance of a portion of said network sandwiched between said probe means and another probe means.

6. Apparatus of claim 1, further comprising:

another probe means located at a portion of said network different from where said probe means is, said analyzer means detecting the resistance of the portion of said network sandwiched between said probe means and said another probe means.

7. A method of evaluating a unit under test having at least one network located spatially in parallel to at least one reference plane, comprising the steps of:

(a) connecting capacitive means and resistive means to said reference plane;

(b) generating a pulse;

(c) applying said pulse to said network;

(d) detecting the amplitude of the leading edge of a signal across said capacitive means in response to the leading edge of said pulse applied to said network; and (e) analyzing said amplitude of said signal to determine the integrity of said network.

8. The method of claim 7, wherein said step (e) further comprises the step of:

ascertaining from said detected amplitude of the leading edge of said signal whether said network is acceptable, shorted, or has a leakage resistance to another network.

9. The method of claim 8, wherein said step (e) further comprises the step of:

using the respective values of said capacitive means, said pulse and a predetermined product value to calculate the value of said leakage resistance, and the capacitance value, if any, between said network and said reference plane.

10. The method of claim 7, further comprising the steps of:

sampling said signal as a series of discrete values over time; and storing said discrete values;

wherein said amplitude comprises some of said discrete values.

11. The method of claim 7, wherein step (e) further comprises the steps of:

storing said signal as a series of discrete values over time;

utilizing the entire set or at least one subset of said series of discrete signals after said leading edge to determine the acceptability of said network.

12. Apparatus for simultaneously effecting resistive and waveform evaluations of a unit under test having at least two networks each located in parallel spatial relationship to at least one reference plane, comprising:

means for generating a pulse;

at least two probe means each located at a corresponding end portion of a to be tested network, one of said probe means applying said pulse to said to be tested network;

capacitive means and resistive means connected to said reference plane;

analyzer means for detecting the resistance of said to be tested network between said two probe means, and the amplitude of the leading edge of a signal provided across said capacitive means in response to said pulse being applied to said to be tested network.

13. Apparatus of claim 12, wherein said analyzer means comprises a first transient analyzer for detecting said resistance of said to be tested network, and a second transient analyzer for detecting said signal provided across said capacitive means.

14. Apparatus of claim 12, wherein said capacitive means comprises a capacitor and said resistive means comprises a resistor connected in parallel to said capacitor, said analyzer means evaluating said amplitude of the leading edge of said signal to determine whether said to be tested network is acceptable, opened, shorted, or has a leakage resistance to another network.

15. A method of detecting and isolating shorts in an unit under test having at least two networks each located in parallel spatial relationship to at least one reference plane, comprising the steps of:

(a) connecting a capacitor and a resistor to said reference plane;

(b) generating a pulse;

(c) utilizing a probe means to apply said pulse to one of said networks;

(d) sampling the amplitude of the leading edge of a signal provided across said capacitor in response to said one network having been stimulated by said applied pulse to detect and isolate any short between said one network and another network.

16. The method of claim 5, further comprising the step of:

analyzing said leading edge of said signal to determine whether said one network is acceptable, opened, shorted, or has a leakage resistance to another network.

17. The method of claim 16, wherein said analyzing step further comprises the step of:

utilizing predetermined values representative of a sample network and respective values of said pulse and said capacitor to calculate at least said leakage resistance, capacitance between said one network and said reference plane, or the capacitance between said one and another networks and said reference plane.

18. The method of claim 15, further comprising the steps of:

positioning said probe means to an end portion of said one network;

positioning a second probe means to the opposite end portion of said one network;

utilizing said two probe means to detect the resistance of said one network.

19. A method of simultaneously effecting resistive and waveform evaluations of a unit under test having at least two networks each located in parallel spatial relationship to at least one reference plane, comprising:
   (a) connecting capacitive means and resistive means to said reference plane;
   (b) generating a pulse;
   (c) positioning two probe means each at a corresponding end portion of a to be tested network;
   (d) applying a pulse from one of said probe means to said to be tested network; and
   (e) simultaneously detecting the resistance of said to be tested network between said two probe means and the amplitude of the leading edge of a signal provided across said capacitive means in response to said pulse being applied to said to be tested network.

20. The method of claim 19, further comprising the step of:
   evaluating said amplitude of the leading edge of said signal to determine whether said to be tested network is acceptable, opened, shorted, or has a leakage resistance to another network.

* * * * *

UNITED STATES PATENT AND TRADEMARK OFFICE
CERTIFICATE OF CORRECTION

PATENT NO. : 5,266,901
DATED : November 30, 1993
INVENTOR(S) : Ka-Chiu Woo

It is certified that error appears in the above-identified patent and that said Letters Patent is hereby corrected as shown below:

On the cover sheet, change the assignee's name to:

--International Business Machines Corporation--.

Col. 1, line 10, change "a" to --an--.

Col. 4, line 1, change "a" to --an--;
       line 57, change "a" to --an--.

Col. 8, line 45, change "C0" to --$c_0$,--
       line 50, change "test" to --tested--.

Col. 11, line 66, change "43" to --42--.

Col. 12, line 22, change "C0" to --$C_0$--;
        line 47, delete "a".

Col. 14, line 36, change "an" to --a--;
        line 50, change "5" to --15--.

Signed and Sealed this

Fifth Day of July, 1994

*Attest:*

BRUCE LEHMAN

*Attesting Officer*   Commissioner of Patents and Trademarks